(12) United States Patent
Dhinojwala et al.

(10) Patent No.: US 9,562,284 B2
(45) Date of Patent: Feb. 7, 2017

(54) MATERIALS AND METHODS FOR THERMAL AND ELECTRICAL CONDUCTIVITY

(75) Inventors: Ali Dhinojwala, Akron, OH (US); Sunny Sethi, Copley, OH (US)

(73) Assignee: The University of Akron, Akron, OH (US)

(*) Notice: Subject to any disclaimer, the term of this patent is extended or adjusted under 35 U.S.C. 154(b) by 28 days.

(21) Appl. No.: 13/508,183

(22) PCT Filed: Nov. 5, 2010

(86) PCT No.: PCT/US2010/055677
§ 371 (c)(1),
(2), (4) Date: Jun. 4, 2012

(87) PCT Pub. No.: WO2011/057105
PCT Pub. Date: May 12, 2011

(65) Prior Publication Data
US 2012/0231270 A1    Sep. 13, 2012

Related U.S. Application Data

(60) Provisional application No. 61/258,640, filed on Nov. 6, 2010.

(51) Int. Cl.
*B32B 9/00* (2006.01)
*C23C 16/26* (2006.01)
*B82Y 30/00* (2011.01)
*C23C 16/01* (2006.01)
*C23C 16/56* (2006.01)
*H01L 23/373* (2006.01)

(52) U.S. Cl.
CPC ............... *C23C 16/01* (2013.01); *C23C 16/26* (2013.01); *C23C 16/56* (2013.01); *H01L 23/373* (2013.01); *H01L 2924/0002* (2013.01); *Y10T 428/2848* (2015.01); *Y10T 428/30* (2015.01)

(58) Field of Classification Search
None
See application file for complete search history.

(56) References Cited

U.S. PATENT DOCUMENTS

| | | | | |
|---|---|---|---|---|
| 2006/0269827 A1* | 11/2006 | Liu | ................. | H01M 4/9008 429/483 |
| 2008/0057265 A1* | 3/2008 | Liang | ................. | B32B 5/02 428/114 |
| 2008/0083612 A1* | 4/2008 | Wang et al. | ............. | 204/192.15 |
| 2008/0280137 A1* | 11/2008 | Ajayan et al. | ................. | 428/375 |
| 2009/0008779 A1* | 1/2009 | Suhir et al. | ................... | 257/751 |

* cited by examiner

*Primary Examiner* — Alexandre Ferre
(74) *Attorney, Agent, or Firm* — Renner Kenner Greive Bobak Taylor & Weber

(57) ABSTRACT

A method of implementing a carbon nanotube thermal interface material onto a heat sink that includes growing carbon nanotubes on said heat sink by chemical vapor deposition and compressing the carbon nanotubes onto metallic surfaces to increase a contact surface area between the carbon nanotubes and the metallic surfaces. The increase in the contact surface area is the area of the carbon nanotubes that is in contact with the metallic surfaces.

3 Claims, 8 Drawing Sheets

| Material | Thermal Conductance | Source |
|---|---|---|
| TC-5688, Thermally conductive compound of silicone polymers and silver particles | 5.67 W/m·K | Dow Corning[9] |
| 5590H Soft Pad Thermal Pads, Conductive ceramic particles filled acrylic polymers | 3.0 W/m·K | 3M[10] |
| Silver particles dispersed in Polysynthetic oils | >8.82 W/m·K | Arctic Silver[11] |
| Carbon Nanotube array | 74-83 W/m·K | Cola et. al Purdue University[12] |

A

B

A

B

MATERIALS AND METHODS FOR THERMAL AND ELECTRICAL CONDUCTIVITY

CROSS REFERENCE TO RELATED APPLICATIONS

This application claims the benefit of International Patent number PCT/US2010/055677 entitled, "Materials and Methods for Thermal and Electrical Conductivity," which claims the benefit of U.S. Provisional Application No. 61/258,640 entitled "Thermal Interface Materials" filed Nov. 6, 2009, and incorporated herein by reference in their entirety.

TECHNICAL FIELD

Certain embodiments of the present invention relate to carbon nanotubes. More particularly, certain embodiments of the present invention relate to carbon nanotubes based thermal interface materials.

BACKGROUND

The continuing advancement in microelectronic devices has led to tremendous growth in the development of smaller circuit boards and processors having greater speed and computing capabilities. Due to these new developments, the amount of heat generated per unit area in these circuit boards has also increased. As a result, overheating is one of the major causes of electronic failures in microelectronic devices.

In order to combat overheating, heat sinks are employed to remove heat from electronic devices. But even the best heat sinks cannot dissipate heat efficiently until there is an intimate contact between the processor unit and the heat sink. For this purpose thermal interface materials ("TIM") are used. These thermal interface materials flow and conform to the surface topologies of solids in contact. Thus, permitting intimate contact. Current thermal interface materials are made of polymer gels, pads or liquids. Some of these polymer liquids may even have ceramic or metal particles to enhance their conductivity, or be based on phase change materials. However even for the most efficient systems, heat transfer across interface is the bottleneck to enhance heat flow. These materials attempt to squeeze air pockets out of the system to enhance heat transfer efficiency between the processor unit and the heat sink. To enhance the heat transfer efficiency significant fraction of conductive particles such as silver may be added to current thermal interface materials.

Yet, there are significant problems associated with current thermal interface materials. Being liquid in nature, these materials tend to leak out over a period of time. This leads to lowered efficiency with respect to time and contamination of the circuit board. In cases where the conductive particles are added, contamination may lead to short circuiting.

As stated above, commercially available thermal interface materials can be categorized under the following categories: 1) thermal greases, 2) thermal pads, and 3) conductive adhesives, 3a) silver epoxies, and 3b) acrylate adhesives with ceramic particles dispersed within them. thermal interface materials based on thermal grease may be silicon based polymers or some other polymers with suitable viscosity and melting points. Being organic in nature, these types of thermal interface materials have high thermal resistance. Conductive fillers are sometimes added to enhance their thermal conductivity. These conductive fillers may reduce overall bulk resistance, but heat transfer across interfaces may not be very efficient since heat transfer may happen via phonons. The other main drawback of these thermal greases is that their low viscosity at higher temperatures may cause leakage. Thus, their efficiency may reduce over a period of time. Such thermal greases are also not suitable for cases where voids are large.

In addition, phase change materials are available as thermal pads. These thermal pads can change their physical characteristics with temperature. Usually phase change materials used for thermal interface materials may change from solid to liquid form at around 45° C.-50° C. These thermal pads are easier to handle than thermal greases. After installation these thermal pads may adhere to the components. Therefore, removing them from the components may cause some damage. Phase change materials are generally put in between heat sinks and a processor, the heat sink being clamped into place. The disadvantage in such cases is that these materials have different physical properties, e.g. modulus and flow, at different installation and working temperatures. Thus, it may not be working at its highest efficiency. Silver filled epoxies may have very high thermal conductance, but these are rigid substances. If the two bonding surfaces have different thermal expansion coefficients, such rigid areas at the interface may cause damage. Junction material with room for expansion and contraction is desirable. FIG. 1 summarizes some of the commercially available thermal interface materials. Therefore, a need exists for a more efficient, robust material for thermal and electrical conductivity. The thermal conductance of commercially available thermal interface materials is shown in FIG. 1, where it is noted that carbon nanotube arrays have been found to provide significantly higher thermal conductance than other commercial materials.

In the current design of thermal interface materials, electronic and radiative heat transfer is used as a guideline in their design. Phononic heat transfer may be ballistic within the bulk of a crystalline solid, but at interfaces phonons may get reflected thus causing low efficiency of heat transfer across an interface. Electronic energy can tunnel across the interfaces in metallic systems. Another efficient way for heat flow across interfaces is radiation.

There have been attempts toward synthesizing carbon nanotube based thermal interface materials. However all the previous attempts had one or more of following shortcomings: 1) The films were not free standing: As-grown carbon nanotubes on copper or other metallic/silicon substrate have been tested for their thermal resistance. For commercial use such systems cannot be used. It is required that the material be available in form of free standing thermal pads; 2) Non-compliable geometries: In many cases the array was not tailored such that it could allow maximum area of contact with the adhering surfaces. Such high area of intimate contact is very important to achieve low thermal resistance across the interfaces; 3) Polymer impregnated systems: In the previous systems the carbon nanotubes have been dispersed on polymeric materials or even in cases where aligned nanotubes were impregnated with polymer based systems, the array was completely embedded in polymers. Such geometries not only lead to higher modulus of the whole system (this less intimate contact, leading to higher thermal resistance), but it will also lead to lower thermal conductivity of the whole system; and 4) Low mechanical stability: For commercial use of the material, it is required that they have high mechanical stability. Such high mechanical stability will allow easy handling, packaging, transportation and re-usability of these systems. Based on the above, there is a need for the development of novel structures of free standing metallic carbon nanotube arrays with conformable geometry.

Further limitations and disadvantages of conventional, traditional, and proposed approaches will become apparent to one of skill in the art, through comparison of such systems and methods with the present invention as set forth in the remainder of the present application with reference to the drawings.

SUMMARY OF THE INVENTION

An embodiment of the present invention comprises a method of implementing a carbon nanotube thermal interface material onto a heat sink that includes growing carbon nanotubes on said heat sink by chemical vapor deposition and compressing the carbon nanotubes onto metallic surfaces to increase a contact surface area between the carbon nanotubes and the metallic surfaces. The increase in the contact surface area is the area of the carbon nanotubes that is in contact with the metallic surfaces.

Another embodiment of the present invention comprises a double sided carbon nanotube adhesive tape that includes free standing carbon nanotube films and a thin layer of a conductive adhesive. The free standing carbon nanotube films are reinforced in the center using the conductive adhesive.

Yet another embodiment of the present invention comprises a double sided gecko-inspired carbon nanotube structure that includes a thin conductive composite and carbon nanotubes that are grown on both sides of the thin conductive composite by chemical vapor deposition.

Based on the above, the invention relates to the development of novel structures of free standing metallic carbon nanotube arrays with conformable geometry. These structures are designed to have low electrical and low thermal resistance. The structures are developed as free standing pads with mechanical stability, and the structures are formed over a large area (e.g., 5 cm×5 cm).

These and other features of the claimed invention, as well as details of illustrated embodiments thereof, will be more fully understood from the following description and drawings.

DETAILED DESCRIPTION

Figures 1, 2:
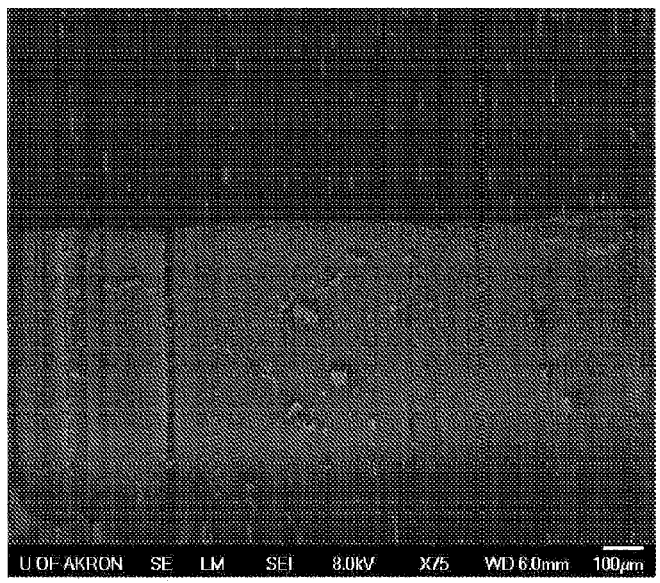
FIG. 1 illustrates thermal conductance of prior art commercially available thermal interface materials.
FIG. 2 is a scanning electron micrograph (SEM) of a carbon nanotube array according to an example of the invention for use as a thermal pad, with the image showing the edge of the array of aligned carbon nanotubes.
Figure 3:
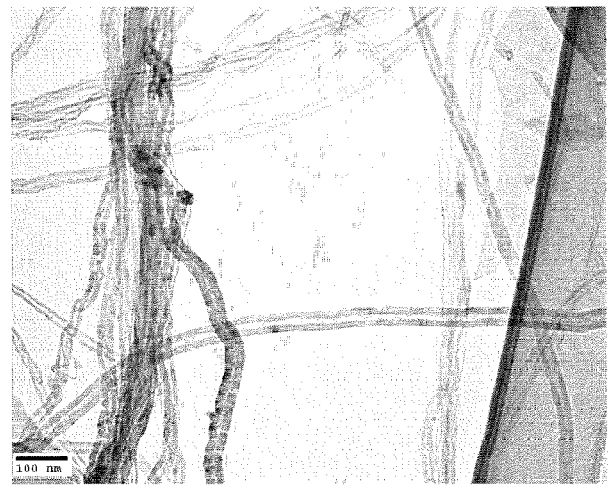
FIG. 3 illustrates a transmission electron micrograph of carbon nanotubes used for creating tunneling pads.
Figure 4:
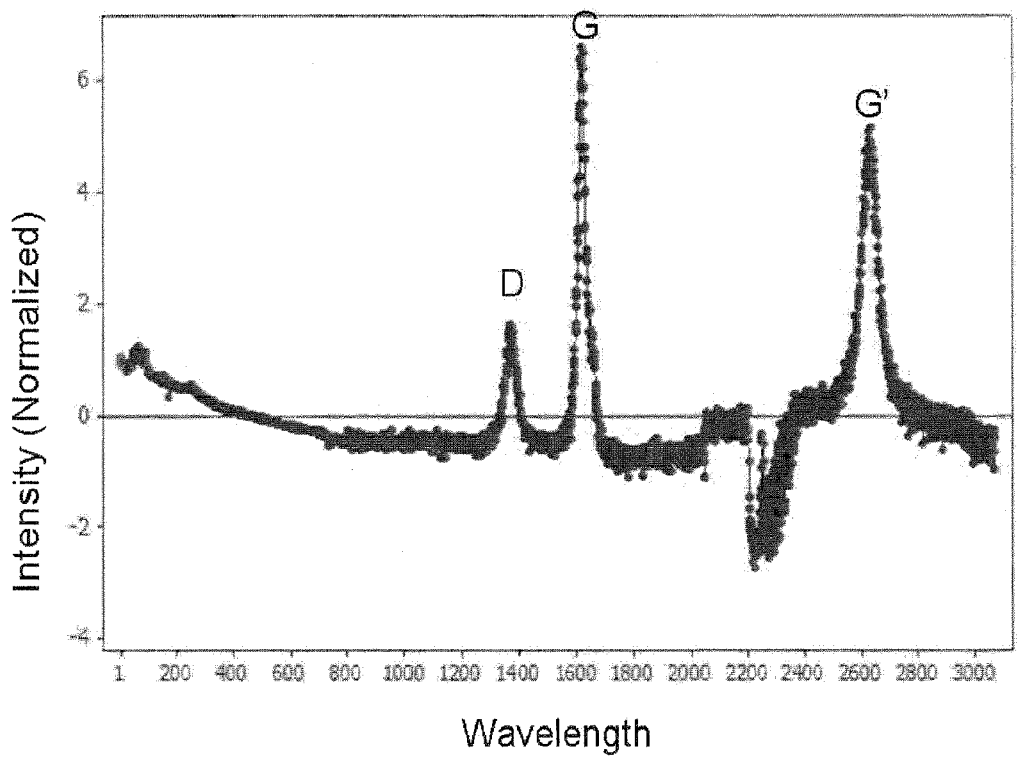
FIG. 4 shows Raman spectra of carbon nanotube structures. The Raman spectrum has three main peaks. G, G' and D. G peak is characteristic feature of graphitic layer (1580 $cm^{-1}$). D&G': Second order Raman scattering. Low intensity of D indicates that there are low defects in the complete structure. Narrow G band indicates long range order in carbon nanotubes.

First, carbon nanotubes ("CNT") have excellent heat transfer properties. In the present invention, examples of carbon nanotube arrays for use as thermal interface materials will be described, but it should be understood that other carbon nanostructures may also be suitably used. In the invention, the thermal interface materials provide enhanced and efficient heat transport across an interface. There is a relationship between heat transfer, electronic conduction, and adhesion with respect to carbon nanotube type adhesives. The design of a carbon nanotube based thermal interface material ("TIM") of the present application is based on quantitative studies of mechanical, electrical, and thermal properties of carbon nanotubes. The present invention may be synthesized in geometries suitable for integration with current heat sink systems. In an example, aligned multi-walled carbon-nanotubes (MWCNT) were synthesized to provide characteristics for more efficient heat transfer. In one aspect, it is desired to synthesize the nanotube geometry with low diameter but thick walls. The creation of carbon nanotube with thick walls is found to increase their electrical conduction. Having higher number of walls of carbon nanotubes make them metallic. However, thicker carbon nanotubes have higher modulus, this can affect the ability to be conformable. Based on this, in an example, aligned carbon nanotube arrays with a predetermined diameter, such as between about 10-15 nm were synthesized, using a chemical vapor deposition process. An array geometry of as-grown carbon nanotubes is shown in scanning electron microscope (SEM) image in FIG. 2. The configuration and characteristics of the individual carbon nanotubes in the array are designed to maximize heat conductance, with transmission electron microscopy (TEM), allowing visualization of the diameter and wall thickness of individual carbon nanotubes in greater detail. A TEM image of this example is shown in FIG. 3, of carbon nanotubes used for creating tunneling pads. As TEM is done on a very small volume of a sample, to confirm the degree of order of the carbon nanotubes in the array, Raman spectroscopy can be used. From a Raman spectrum it was observed that the carbon nanotube arrays grown using a chemical vapor deposition process had long range order. FIG. 4 shows Raman spectrum of the carbon nanotube arrays according to this example. As seen in FIG. 4, the Raman spectrum has three main peaks. G, G' and D. G peak is a characteristic feature of graphitic layer (1580 $cm^{-1}$). The other peaks, D and G' show second order Raman scattering. The low intensity of D indicates that there are low defects in the complete structure, while the narrow G band indicates long range order in carbon nanotubes.

Figure 5:
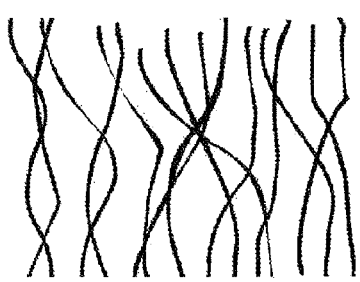
FIG. 5 shows a schematic illustration of entanglement effects in aligned carbon nanotubes, for carbon nanotubes with short length (<100 microns) and indicating only a few entanglement points.
Figure 6:
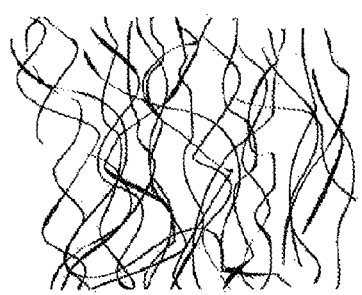
FIG. 6 shows a schematic illustration of entanglement effects in aligned carbon nanotubes, showing a zoomed in region of longer carbon nanotube array.

According to examples of the invention, various geometries may be created for use as a thermal interface material. Two geometries were developed for carbon nanotube based thermal pads. The first geometry is comprised of free floating aligned carbon nanotube arrays and the second geometry involves elastomer impregnated carbon nanotube array. Regarding the free standing aligned carbon nanotube thermal pad example, reference is made to FIGS. 5 and 6. The carbon nanotubes are long molecules with high modulus. Due to their rigid structure, carbon nanotubes have high persistent lengths as compared to polymer molecules. This characteristic of the carbon nanotubes having persistent lengths is significant in that it determines how well the structure would entangle on itself for a given height of the carbon nanotube array. For the given carbon nanotubes, it was observed that for arrays greater than about 200 micron in height, the structure had mechanical stability such that it could be peeled off silicon substrate and used as a free standing film. However such entanglements also lead to higher rigidity of the whole array thus reducing their ability to form intimate contacts. The sketches in FIGS. 5 and 6 show how the degree of entanglement can increase with the length of carbon nanotubes, and impart mechanical stability to the free standing films. The entanglement effects in aligned carbon nanotubes are shown in FIG. 5 for carbon nanotubes with short length (<100 microns), which will have few entanglement points, while FIG. 6 shows a zoomed in region of longer carbon nanotube array, indicating higher entanglement.

Figure 7:
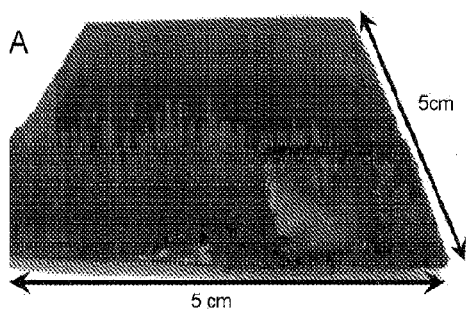
FIG. 7 shows a large area aligned carbon nanotube array based free standing films, showing a large area (5 cm×5 cm) of aligned carbon nanotube film (500 microns thick).
Figure 8:
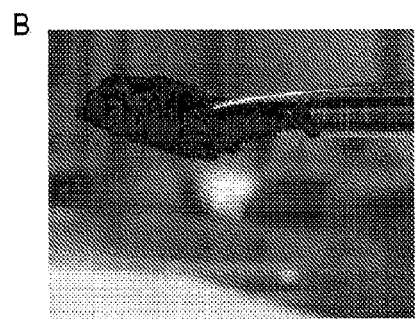
FIG. 8 shows a 1 cm×1 cm area was peeled of the array using a blade, from the film that was peeled of the larger area of carbon nanotube array.

In aspects of the invention, the carbon nanotube array may be desired to be formed over a large area to be useful for various heat transfer applications. In an example, large areas of these metallic carbon nanotube arrays were created. FIG. 7 shows an optical image of an example of one such carbon nanotube array. The optical image of FIG. 7 shows a large area (about 5 cm×5 cm) of an aligned carbon nanotube film which is about 500 microns thick. Thermal pads of required shape and size can be extracted from these arrays for example, or individual arrays may be formed of a desired size initially. For example, FIG. 8 shows an optical image of an about 1 cm long thermal pad removed from the base array using a surgical blade. Such properties allow for large scale production and commercialization of these carbon nanotube thermal pads. Large area aligned carbon nanotube arrays can thus be formed as free standing films.

Figure 9:
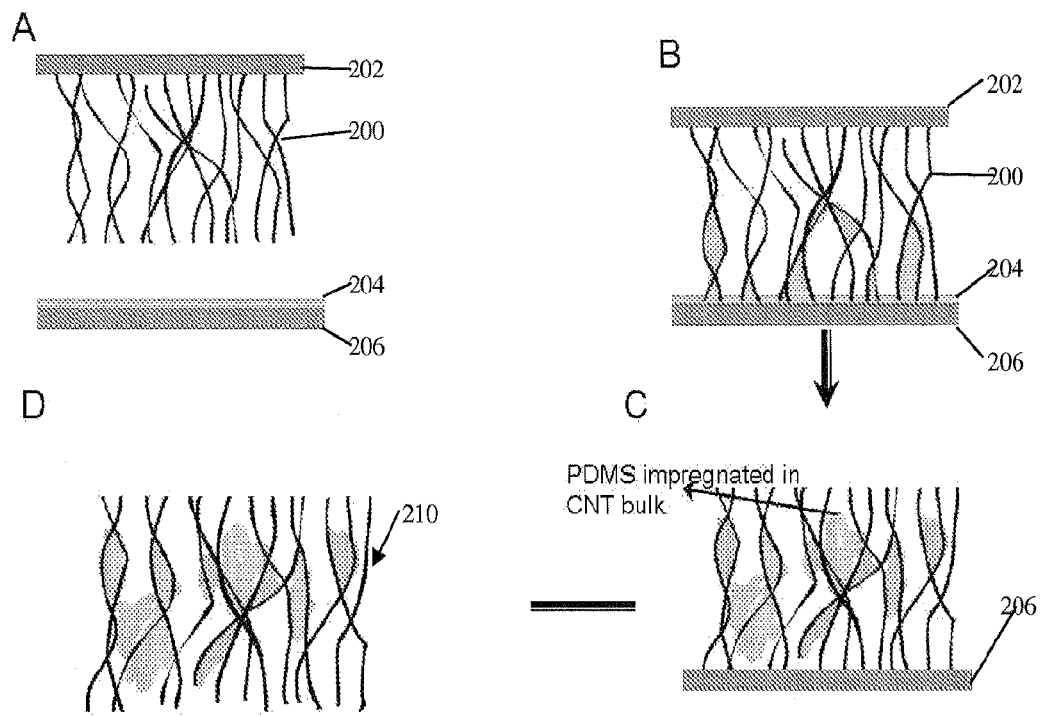
FIG. 9 shows a schematic illustration to demonstrate the mechanism to form aligned CNT-elastomer composite structure while retaining electrical conductivity of CNT array. (A) As-grown CNT array is lowered on a thin film of poly(dimethyl siloxane) (PDMS). (B) Since the PDMS film is thinner than CNT geometry, it does not engulf CNT array completely but seeps in the structure via capillary action. (C) The structure is then inverted and the elastomer is allowed to cure over a period of 24 hours. Longer curing time allows elastomer to flow in and form a network within the CNT array.
Figure 10:
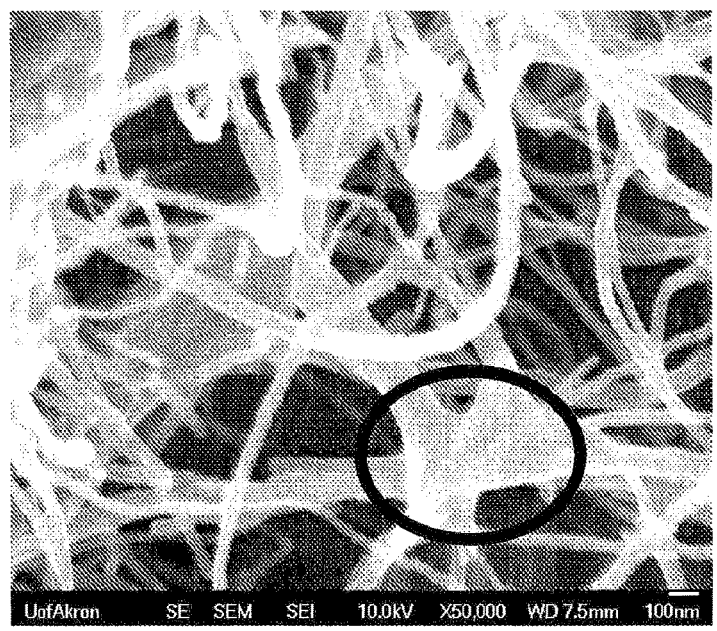
FIG. 10 shows a high resolution SEM image of CNT-PDMS composite structure. The above SEM image shows region in CNT array where PDMS has bound itself to different nanotubes to reinforce the whole structure. The region in the circle is where PDMS is bound to multiple CNTs.

In another example, a thermal interface materials is formed from an elastomer impregnated carbon nanotube thermal pad. The geometries synthesized using a chemical vapor deposition process have mechanical integrity, such as according to the prior example. For desired use of CNT based TIM, the nanotube array and nanotubes should maintain their structural integrity under various mechanical stresses (compression and stretching for example). To enhance the mechanical properties for various applications, the array may be at least partially impregnated, wherein the MWCNT's and structures are partially impregnated using a soft elastomer. As an example, a poly(di-methyl siloxane) PDMS can be used for this purpose. A PDMS prepolymer solution, which may be a viscous mixture of base/curing agent, such as in a weight ratio of 10:1, may be poured over the aligned nanotube structures on substrate. The arrays of nanotubes are embedded within the soft polymer matrix without disturbing the shape, size or alignment of the nanotubes. A particular architecture of aligned MWNT architectures may be provided according to examples, and it be recognized that any desired architecture may be formed. In an example, subsequent to embedding the nanotube structures partially on the substrate within the soft prepolymer solution, any excessive polymer solution may be removed to obtain a desired thickness for the nanotube-PDMS composite film being produced. In this manner, the particular thickness of the composite film may be controlled for optimizing the arrangement for a particular application or environment. As seen in FIG. 9, the nanotube array 200 may be formed on a substrate 202. The free ends of the nanotubes 200 may be inserted into a PDMS prepolymer solution 204 provided on a further substrate 204. The PDMS is then thermally cured with the PDMS impregnated in the nanotube bulk, and subsequently, a self-standing nanotube- PDMS composite film 210 may be peeled off from the substrates 202 and 206. This process can be used to make nanotube-PDMS composite films, or other suitable process could be used. In different examples, the diameter of the MWNT structures may be in the range of 1-500 nm using photolithography. In this example, the nanotube array has a portion of the nanotubes extending from the film after PDMS infiltration, and subsequent completion of polymerization. It is possible to transfer desired architectures of nanotubes into the film, to include smaller and/or more densely distributed nanotube architectures, or larger and/or less densely distributed nanotube architectures into the PDMS matrix, such as structures being only a few nm to micrometers in scale. Further, these structures effectively retain their original alignment, shape, and size inside the resulting composite matrix, after polymerization and subsequent to peeling off from the substrates. To facilitate this, the selected polymeric materials may be chosen to provide conformal filling of the spaces between individual nanotubes. If desired, other chemical agents may be used or polymeric materials chosen to enhance wettability relative to the nanotube architectures to form a relatively defect-free composite film retaining the original nanotube architecture. Although the above examples describe the use of multi-walled carbon nanotubes, other carbon nanostructures may be used in accordance with the invention. Similarly, although the polymer used in the example is a PDMS, other elastomeric polymers (e.g. glassy PMMA), with different moduli and flexibility, may be used for other applications as contemplated in the invention. The ability to use various polymers provides flexibility to tailor the flexible substrate produced for any desired application. Chemical properties may also be controlled as desired for various applications. In the invention, after impregnation of the aligned carbon nanotube structures with polymers, the geometries don't lose their conductivity and compliability. To enhance mechanical properties without sacrificing properties of as-grown CNT array, a minimum amount of elastomer is used. For desired impregnation, the methodology of using the capillary action of aligned carbon nanotube structures to transport a little amount of elastomer in the bulk of the array may be used. The process is depicted schematically in FIG. 10, wherein a high resolution SEM image of CNT-PDMS composite structure is shown. The SEM image shows a region in CNT array where PDMS has bound itself to different nanotubes to reinforce the whole structure, relating to the region in the circle.

Figure 11:
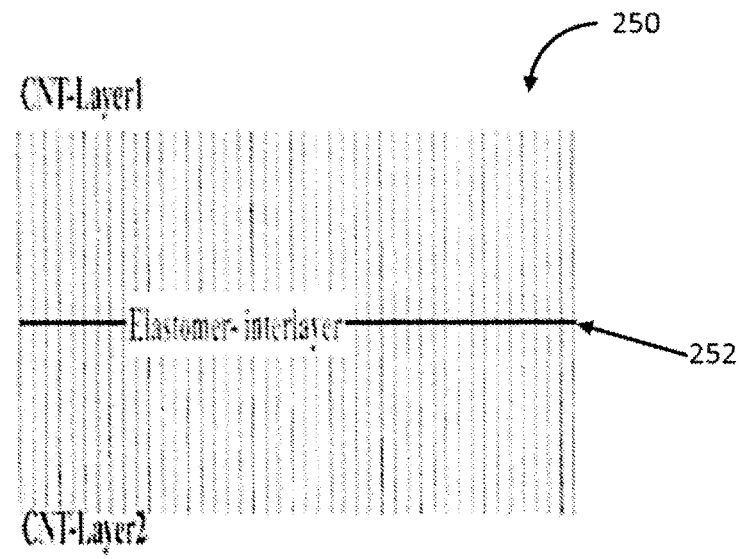
FIG. 11 shows a CNT-PDMS composite structure formed according to an example of the invention. The structure has elastomer layer only in the center part of the bulk. This elastomer layer imparts mechanical stability to the whole structure without interfering with its ability to form intimate contacts with bonding surfaces.
Figure 12:
FIG. 12 is an optical image of CNT-PDMS-CNT composite structure according to an example.

An alternate process to form reinforced aligned carbon nanotube structures is shown in FIG. 11, wherein the figure shows a different CNT-PDMS composite structure 250 is formed. The structure 250 has elastomer layer only in the center part of the bulk at the elastomer interlayer 252. This elastomer layer imparts mechanical stability to the whole structure 250 without interfering with its ability to form intimate contacts with bonding surfaces. The structures 250 may be formed using a high viscosity commercial PDMS blend (Sylgard 186) for example, or other suitable polymeric materials. A thin film of this PDMS was formed on two aligned arrays, and the arrays were then bound together to form the structure 250. Higher viscosity PDMS was used for this process so that it would not migrate to the bulk of CNT arrays, either before or after being bound together. To reduce the migration of PDMS chains in the bulk of CNT arrays, higher curing rates can also be used. A depiction of the structure 250 is shown in FIG. 12, being an optical image of CNT-PDMS-CNT composite structure. Upon testing, the structure had an electrical resistance of 5.6Ω along its thickness under a load of 20 kPa. The stress at break was 400 kPa.

Figure 13:
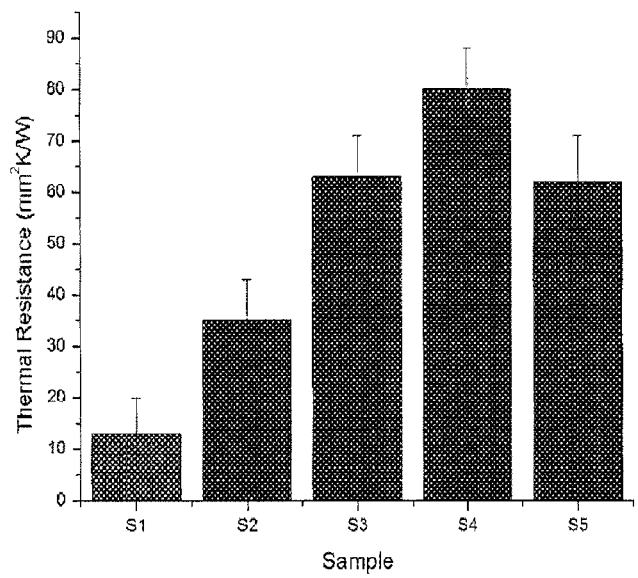
FIG. 13 shows a graph of thermal resistance for five different geometries of examples of the invention.

In relation to the examples of TIM's according to the invention, heat flow measurements were made on different samples. Thermal resistance was measured based on ASTM D 5470 standard. The graph of FIG. 13 compares thermal resistance of five different geometries that were tested. The five different geometries included sample S1, which was an as-grown carbon nanotube array 200 microns thick peeled off a substrate. Sample S2 is as-grown carbon nanotube array 500 microns thick peeled off the substrate. Samples S3 and S4 are 100 and 200 micron thick CNT-PDMS composite structures respectively, grown using process as described in FIG. 9. Sample S5 is a 1 mm thick sample as shown in FIG. 12.

Figure 14:
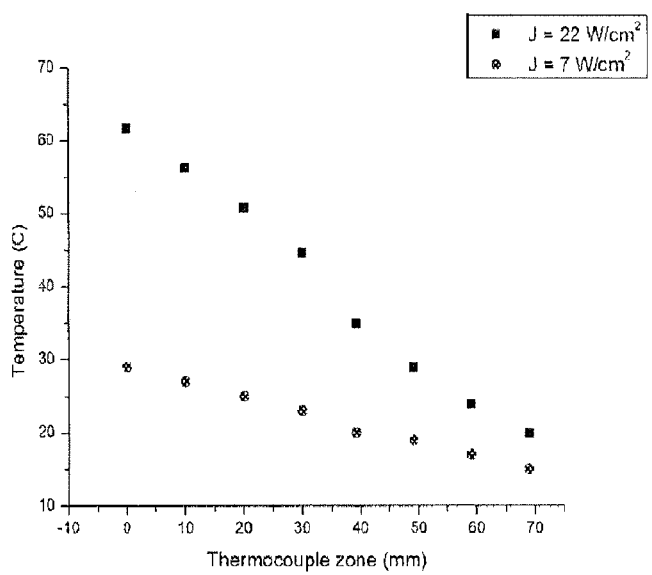
FIG. 14 shows a graph of the temperature profile along ASTM D5470 standard for two different values of heat flux (22 $W/cm^2$ and 7 $W/cm^2$) for a 200 micron thermal pad example of the invention.

For carbon nanotube thermal pads according to the invention, with a thickness less than 200 μm, thermal resistance of the interface became comparable to that of the bulk copper for low values of heat flux. Therefore, higher heat fluxes were used for the above calculations. The graph of FIG. 14 shows the temperature profile for a 200 μm thick carbon nanotube array for two different values of heat flux. The graph shows the temperature profile along ASTM D5470 standard for two different values of heat flux (22 W/cm$^2$ and 7 W/cm$^2$). It was observed that for the 200 micron thermal pad, temperature drop across the interface for low heat flux became similar to temperature drop across bulk copper. However at higher heat flux, higher temperature drop was observed.

The examples of CNT based TIM according to the invention provide low thermal resistance and high mechanical integrity. The composite structure of CNT with polymers can be formed without embedding CNTs completely in polymeric matrices, and allow the composite structure to conform to surfaces and provide enhanced intimate surface contact for efficient thermal conduction. The composite films formed according to the invention provide an extremely flexible and otherwise deformable matrix which may allow the film to be produced in any of a variety of desired configurations and geometries, while maintaining a nanostructure architecture therein. The composite films according to the invention provide stable thermal conduction characteristics over large percentages of strain imposed upon the flexible composite.

Figure 15:
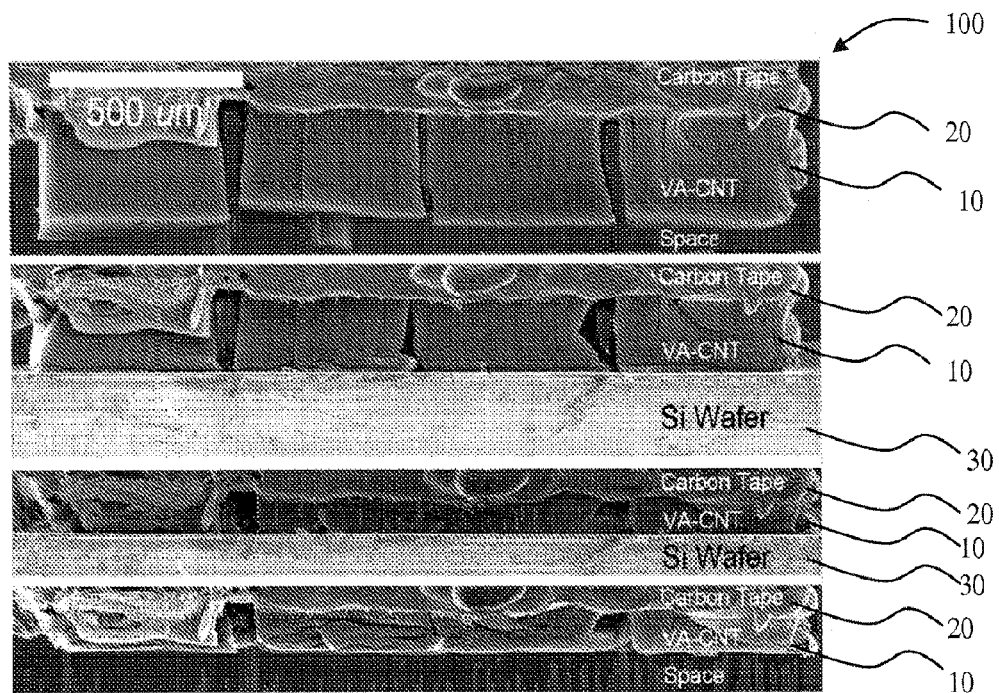
FIG. 15 illustrates Scanning Electron Microscope (SEM) images of carbon nanotube structures being compressed on a silicon wafer.

The CNT based TIM according to the invention includes individual CNT's that tend to stick to surfaces without the use of any type of glue or adhesive, based on van der Waals ("vdW") interactions. Turning to FIG. 15, carbon nanotubes 10 may be developed for improving surface area intimate contact, which are compliant and may conform to the topography of a substrate 30. The substrate 30 may be a Si wafer for example, such as the Si material used to form a processing circuit component or the like, and which it is desired to conduct heat from. The compliance is a factor in increasing the contact area by at least a factor of two with pressure. The materials of the present invention may also have higher thermal stability and self cleaning properties.

The carbon nanotubes 10 are solid substances in which high area of contact is attained via deformation of the hair-like structure. These materials may also have little to no contamination and include heat transfer abilities. If effective electronic contact can be attained between two surfaces, the carbon nanotubes 10 will also have effective thermal contact. The carbon nanotubes 10 also have high thermal stability and their characteristics do not relatively change in a "working" temperature range. The carbon nanotubes 10 are highly compliable materials and can deform to compensate for differences in thermal expansion of adhering components.

The following are properties and advantages of carbon nanotube TIM's 100. Regarding thermal conductivity of the carbon nanotubes 10, thermal conductivity is essential to low bulk thermal resistance and the carbon nanotubes 10 have very high thermal conductivity. Therefore, the bulk thermal resistance of the carbon nanotubes 10 would be relatively low. Regarding electrical conductivity, the carbon nanotubes 10 are electrically conductive. Conventionally, lower electrical conductance is desirable for thermal interface materials 100. Although electrical conductivity is not harmful for processors, if other components become contaminated, short circuiting may occur. The carbon nanotube structures 10 are mechanically stable and may not involve liquid ingredients. Thus, contamination is reduced dramatically. Regarding spreading characteristics, it is desirable that thermal interface materials 100 have good flow properties to enable good contact with a processor and/or a heat sink. Particular moduli of the carbon nanotubes 10 are highly compliable. The carbon nanotubes 10 of the present invention can form intimate contacts with even, rough surfaces, which allow for better heat transfer and flow efficiency. The heat flow in the carbon nanotubes 10 is electronic, which allows for heat flow across interfaces that are much higher.

Other properties and advantages of the gecko-inspired carbon nanotube adhesives 100 include long term stability factors, which include susceptibility to contamination, thermal stability, and fungal resistance. Regarding susceptibility to contamination, the carbon nanotubes 10 exhibit self cleaning behaviors and if particles, such as dust, settle on the carbon nanotubes 10, the particles can be cleaned by either blowing air on them or by mechanical vibrations. Regarding thermal stability, the carbon nanotubes 10 can withstand extreme thermal conditions and embodiments of the present invention may withstand temperatures of up to 400° C. for example, which is much higher than what is specified for typical thermal interface materials. Regarding fungal resistance, the carbon nanotubes 10 are dry structures with delocalized π electrons. Therefore, fungal growth on the carbon nanotubes 10 is minimum.

Regarding ease of application, when compared to current thermal interface materials that are liquid in nature or may need external stimuli such as heat or a chemical, the carbon nanotubes 10 of the present invention are dry and ready to use and/or reuse after production. The carbon nanotubes 10 can be applied at room temperature without any further heat treatment, as may be required by types of other thermal interface materials. Regarding adhesiveness, sufficient adhesiveness is helpful to maintain the stability of thermal interface materials on heat sinks. Typically, heat sinks come with pre-applied thermal interface materials and need to be transported carefully in order for the thermal interface material structure not to be destroyed. In examples of the present invention, the materials may be applied later, and are not subject to significant damage during transport or handling. In an example of the present invention, the carbon nanotube thermal interface material 100 is highly adhesive and remains on a heat sink even under mechanical stress. Regarding elastic modulus, the ability of a material to deform by applying light loads is a desired quality of thermal interface materials for various applications. Yet another example of the present invention uses CNT's that are highly compliable, wherein individual carbon nanotubes 10 may have a high bulk modulus of approximately 1 TPa. The carbon nanotube brushes 10 may behave like a soft foamy structure.

An example of the present invention includes a system 100 consisting of a bulk of or architecture of multi-walled, vertically aligned carbon nanotube structures 10 embedded in a suitable, flexible matrix or backing 20. The vertically aligned carbon nanotube structures 10 may be grown on a substrate 30 such as silicon dioxide, SiC>2, or another substrate using a chemical vapor deposition process, or any other process one skilled in the art would understand in order to grow the carbon nanotube structures 10. In order to attain high adhesion, the thermal interface materials 100 may be compliable enough to take the topography of the surfaces in contact. A suitable diameter of the carbon nanotubes 10 is chosen to obtain intimate contact. FIG. 15 demonstrates compressed carbon nanotube structures 10 under a scanning electron microscope, which also displays the carbon nanotubes 10 bending and buckling at the end, creating large areas of contact. An embodiment of carbon nanotube structures 10 in the present invention may include a diameter of about 8 nm, on average, which is a highly compliable foam-like structure which can deform, and increase contact area by a factor of two or more, and adapt to the topography of a surface.

Regarding adhesion, the vertically aligned nanotube structure 10 embedded in a flexible backing 20, synthetic tape, may be pressed on various surfaces and pulled parallel to the surface at a constant speed in order to obtain measurements and characteristics. It can be observed that the carbon nanotube material 100 has similar adhesion characteristics to both hydrophilic and hydrophobic surfaces. Moreover, the carbon nanotubes 10 can be cleaned using mechanical vibration or by blowing air. High adhesion may be required not only for better transport of energy, but also for overall stability of the whole system. The properties and characteristics stated above contribute to the carbon nanotube thermal interface material 100 to be used as a reversible conductive adhesive.

The CNT's conform to the topography of a surface and create intimate contact with the surface. This intimate contacts leads to enhanced van der Waals interactions. In the present invention, vertically-aligned carbon nanotubes 10 may be grown on glass, silicon, silicon with a silica layer, metal surfaces, and any other surfaces known to one skilled in the art, at around 750° C. The diameter and mechanical properties of the carbon nanotubes 10 are chosen to achieve high frictional and shear forces. The carbon nanotubes 10 for the carbon nanotube thermal interface materials 100 may be 8-10 nm in diameter and 100-400 micron in height. A forest of the carbon nanotubes 10 have very low modulus and may irreversibly compress to create a high contact area with a surface of another material. FIG. 15 illustrates an image of the carbon nanotubes 10 compressed in contact with a gold-coated silicon wafer 30. Compressibility of the carbon nanotubes 10 create a very intimate contact area with the surface of the wafer 30. The carbon nanotubes 10 conform to the topography of the surface and work on smooth and rough surfaces. The carbon nanotubes 10 may increase contact area with applied pressure by a factor of two. In comparison, larger diameter carbon nanotubes have a higher modulus and adhesion is weaker than softer carbon nanotubes.

Figure 16:
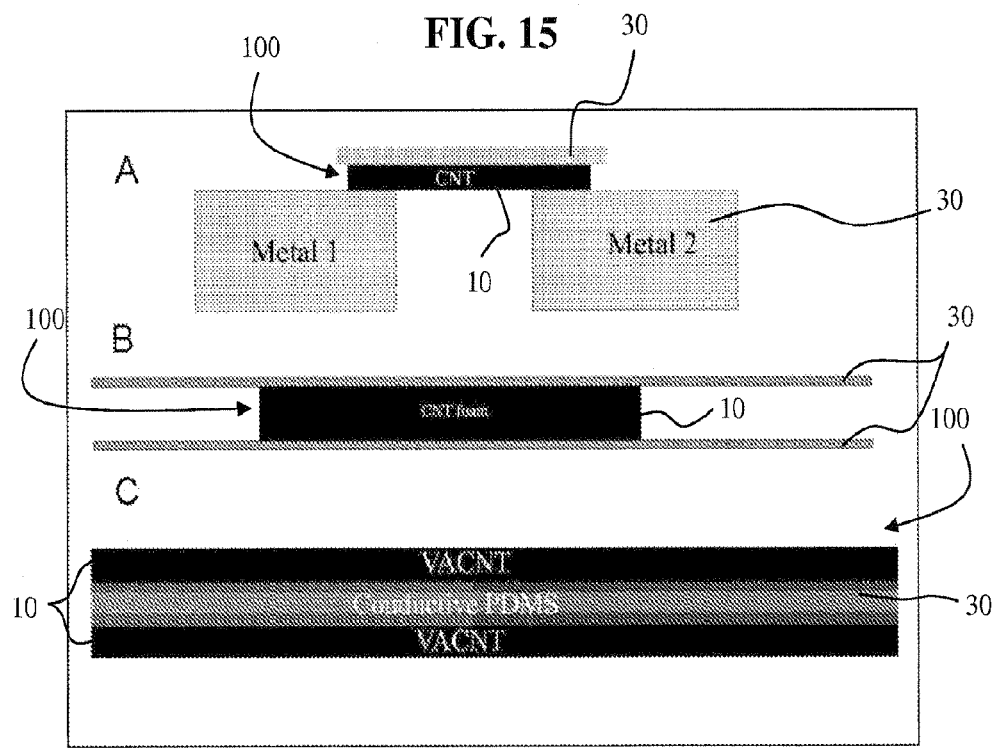
FIG. 16 illustrates various geometries of carbon nanotubes to be used as conductive adhesives: A) shows carbon nanotube based conductive adhesives that may be used as electrical or thermal interconnects between two metallic junctions, B) shows a carbon nanotube foam-like structure in between two metallic plates acting as a conductive adhesive, and C) shows a free standing, stable adhesive film of gecko inspired carbon nanotubes' structure.

FIG. 16A illustrates a sketch of geometry developed to be used as a conductive carbon nanotube adhesive 100 that may be also be used as an electrical or thermal interconnection between two metallic or non-metallic junctions or substrates 40. The carbon nanotube thermal material 100 may be used as a thermal interface material, wherein the carbon nanotube thermal materials 100 may be a free standing film that can be incorporated between two surfaces or metallic plates 30 acting as a conductive adhesive as shown in FIG. 16B. A structure with CNT's bound by a central conductive PDMS as described previously may also allow either side to be available for contacting a surface, as shown in FIG. 16C. The carbon nanotube materials 100 are highly compliable and provide intimate contact between particular surfaces.

An example of the present invention enables carbon nanotubes 10 to be grown on a substrate 30 such as silicon dioxide, $SiO_2$, and then be transferred onto a heat sink. Such geometries may be helpful where heat sink manufacturers sell heat sinks with pre-applied thermal interface materials. Another embodiment of the present invention is a double sided carbon nanotube adhesive tape 100 that may be free standing carbon nanotube films 10 reinforced in the center using a thin layer of a conductive adhesive. Such geometries may be helpful where thermal interface materials are sold separately. Yet another embodiment of the present invention is a double sided carbon nanotube structure 100 from grown carbon nanotubes 100 on both sides of a conductive composite such as thin copper/aluminum film.

Figure 17:
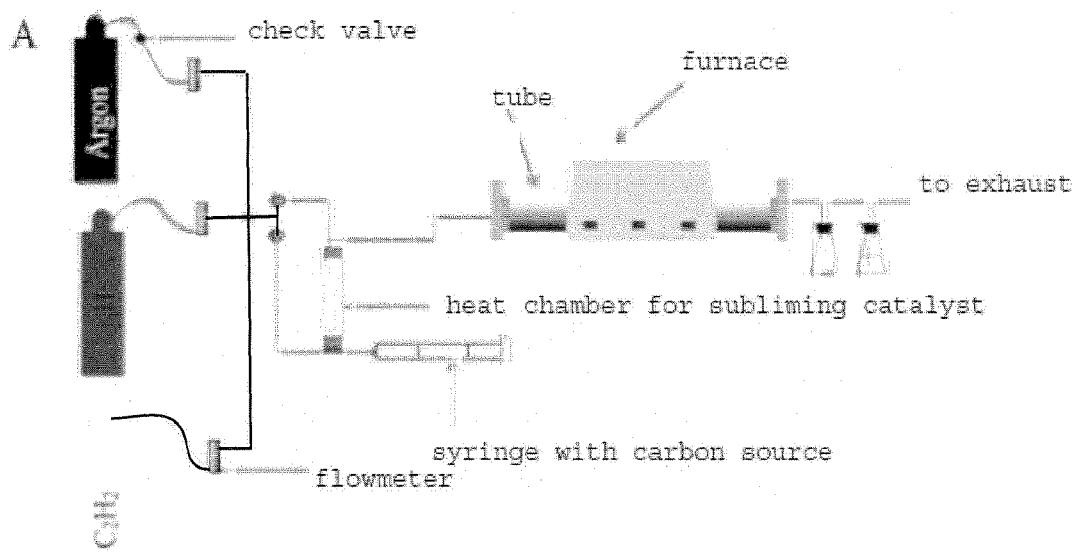
FIG. 17 illustrates an embodiment of a setup for manufacturing and testing carbon nanotubes' thermal interface materials: A) shows a setup of a chemical vapor deposition setup used to grow carbon nanotubes, B) shows an instrument that measures electrical and thermal resistance of a carbon nanotube thermal interface material while pressing the carbon nanotube foam in between two solids, C) shows a Scanning Electron Microscope ("SEM") stub that images morphology of carbon nanotube structures under compression, and D) shows an instrumental setup that can operate from atmospheric pressure to ultra high vacuum conditions, the carbon nanotubes are on a copper stub and the second electrode is an indium tin oxide ("ITO") glass, wherein the indium tin oxide glass can be lowered and brought into contact with the nanotubes and electrical resistance of the whole system can be monitored as a function of compression of carbon nanotubes.
Figure 17:
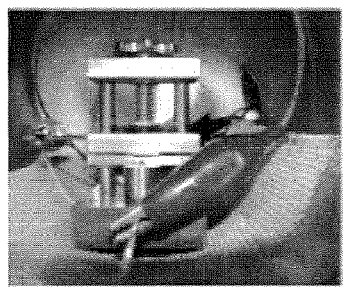
Figure 17:
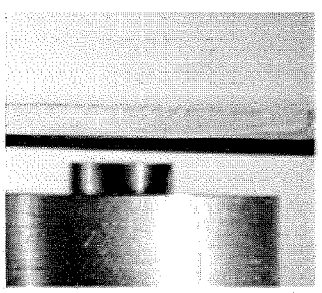
Figure 17:
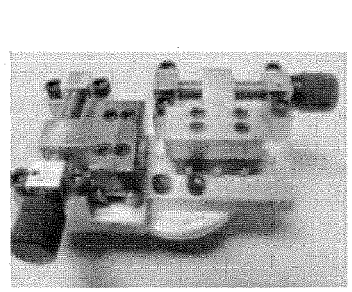

FIG. 17 illustrates an embodiment of a setup for manufacturing and testing carbon nanotubes' thermal interface materials 100: A) shows a setup of a chemical vapor deposition setup used to grow carbon nanotubes 10, B) shows an instrument that measures electrical and thermal resistance of the carbon nanotube thermal interface material 100 while pressing the carbon nanotube foam 100 in between two solids, C) shows a Scanning Electron Microscope ("SEM") stub that images morphology of the carbon nanotube structures 10 under compression, and D) shows an instrumental setup that can operate from atmospheric pressure to ultra high vacuum conditions, the carbon nanotubes 10 are on a copper stub and the second electrode is an indium tin oxide ("ITO") glass, wherein the indium tin oxide glass can be lowered and brought into contact with the carbon nanotubes 10 and electrical resistance of the whole system can be monitored as a function of compression of the carbon nanotubes 10.

While the claimed subject matter of the present application has been described with reference to certain embodiments, it will be understood by those skilled in the art that various changes may be made and equivalents may be substituted without departing from the scope of the claimed subject matter. In addition, many modifications may be made to adapt a particular situation or material to the teachings of the claimed subject matter without departing from its scope. Therefore, it is intended that the claimed subject matter not be limited to the particular embodiment disclosed, but that the claimed subject matter will include all embodiments falling within the scope of the appended claims.

What is claimed is:

1. A double sided carbon nanotube structure comprising:
   a first carbon nanotube array having a first surface and a second surface, said first surface coated with a first film of elastomer; and
   a second carbon nanotube array having a first surface and a second surface, said first surface coated with a second film of elastomer;
   wherein the first surface of said first carbon nanotube array and the first surface of said second carbon nanotube array are bound to each other directly to form a double sided carbon nanotube structure having an elastomer interlayer with a thickness equal to the combined thicknesses of said first and said second films.

2. The double sided carbon nanotube structure of claim 1, wherein the elastomer is polydimethylsiloxane (PDMS).

3. The double sided carbon nanotube structure of claim 1 wherein said double sided carbon nanotube structure is a free-standing carbon nanotube film.

* * * * *